United States Patent [19]
Mir et al.

[11] Patent Number: 4,975,299
[45] Date of Patent: Dec. 4, 1990

[54] VAPOR DEPOSITION PROCESS FOR DEPOSITING AN ORGANO-METALLIC COMPOUND LAYER ON A SUBSTRATE

[75] Inventors: Jose M. Mir, Webster; Alex Wernberg, Rochester, both of N.Y.

[73] Assignee: Eastman Kodak Company, Rochester, N.Y.

[21] Appl. No.: 430,397

[22] Filed: Nov. 2, 1989

[51] Int. Cl.$^5$ .................... C23C 16/19; C23C 16/22; C23C 16/46

[52] U.S. Cl. .................... 427/51; 427/226; 427/255; 427/255.2; 427/102; 427/104; 427/234

[58] Field of Search ........ 427/248.1, 255, 49, 427/50, 51, 123, 124, 226, 229, 250, 251, 255.1, 255.2, 255.6, 314; 437/225, 102, 104, 234; 156/612, 613, 614

[56] References Cited

U.S. PATENT DOCUMENTS

| | | | |
|---|---|---|---|
| 3,291,657 | 12/1966 | Sirtl et al. | 437/104 |
| 3,705,059 | 12/1972 | Kun | 427/248.1 |
| 3,754,975 | 8/1973 | Spiller | 427/33 |
| 3,802,967 | 4/1974 | Ladany | 357/4 |
| 4,250,205 | 2/1981 | Constant et al. | 427/248.1 |
| 4,279,670 | 7/1981 | Steele | 427/248.1 |
| 4,427,714 | 1/1984 | Davey | 437/81 |
| 4,543,275 | 9/1985 | Akashi et al. | 427/255.5 |
| 4,594,264 | 6/1986 | Jensen | 427/54.1 |
| 4,752,455 | 6/1988 | Mayer | 427/53.1 |
| 4,759,951 | 7/1988 | Itoh et al. | 427/76 |
| 4,780,334 | 10/1988 | Ackerman | 427/248.1 |
| 4,833,103 | 5/1989 | Agostinelli et al. | 437/231 |
| 4,892,751 | 1/1990 | Miyake et al. | 427/42 |
| 4,895,735 | 1/1990 | Cook | 427/53.1 |

FOREIGN PATENT DOCUMENTS 0288166 10/1988 European Pat. Off. ........ 427/248.1

OTHER PUBLICATIONS

Veuhoff et al., "Metalorganic CVD of GaAs in a Molecular Beam System", Journal of Crystal Growth, vol. 55, No. 1, pp. 30–34, 1981.
F. H. Nicoll, Journal of the Electrochemical Society, 11/63, 1165–1167.
P. H. Robinson, RCA Review, 12/63, 574–584.
F. Chavez et al., Journal of Applied Physics, 1983, 6646–6651.
D. Cote et al. Photoresist Stripping, 1986, 1925–1934.
A. H. Cowley et al., Journal of the American Chemical Society, 1988, 6248–6249.
D. E. Heaton et al., Polyhedron, 1988, 1901–1908.
R. K. Schulze et al., Journal of Vacuum Science Technology, 2162–2163, 1988.
M. J. Almond et al., Chemistry in Britain, 1988, 1130–1132.
Kouvetakis et al., Chemistry of Materials, 1989, 476–478.
D. C. Boyd et al., Chemistry of Materials, 1989, 119–124.

Primary Examiner—Norman Morgenstern
Assistant Examiner—Margaret Bucker
Attorney, Agent, or Firm—Paul A. Leipold

[57] ABSTRACT

The invention comprises applying to a substrate a precursor of an organo-metallic compound, the precursor preferably consists of one or more pairs of ligand substituted Group III and V elements. The precursor is decomposed and deposits onto a receiving layer held at the decomposing temperature of the vaporized material.

20 Claims, 2 Drawing Sheets

VAPOR DEPOSITION PROCESS FOR DEPOSITING AN ORGANO-METALLIC COMPOUND LAYER ON A SUBSTRATE

FIELD OF THE INVENTION

The present invention is directed to a process of producing a layer of a Group III-V compound by vapor deposition.

PRIOR ART

All references to Periods and Groups within the Periodic Table of Elements are based on the format of the periodic table adopted by the American Chemical Society and published in the *Chemical and Engineering News*, Feb. 4, 1985, p. 26. In this form the prior numbering of the periods was retained, but the Roman numeral numbering of groups and designations of A and B groups (having opposite meanings in the U.S. and Europe) was replaced by a simple left to right 1 through 18 numbering of the groups.

Following the discovery of the transistor, semiconductor application interest focused on Group IV elements, first primarily on germanium and then on silicon. It was later recognized that useful and, for many applications, superior semiconductor properties are provided by III-V compounds—that is, compounds consisting of Group III and Group V elements. This has led to intensive investigations of processes for preparing layers of III-V compounds, particularly processes offering the stringent control of III-V compound layer stoichiometry, purity, uniformity, and thickness required for successful semiconductor applications.

The most commonly employed approach for preparing III-V compound layers is chemical vapor deposition (CVD), which includes both vapor phase epitaxy (VPE) and metalorganic chemical vapor deposition (MOCVD). Although extensively used, this process exhibits a number of disadvantages. First, there is the safety hazard of working with toxic gases. Second, each of the Group III element and Group V element compounds are pyrophoric, reacting spontaneously with oxygen. Third, with the Group III and Group V elements being introduced as separate gases, the potential for layers which are stoichiometrically unbalanced in either the concentration of the Group III or Group V element is always present, and precise gas metering is required for balanced stoichiometry.

In the MBE method a Group III element and a Group V element are introduced under high vacuum into a reaction chamber and thermally reacted in the presence of a substrate. (For the MBE process, working with high vacuum equipment is time-consuming, cumbersome, and operationally limiting.)

Constant et al U.S. Pat. No. 4,250,205 discloses a variation on the CVD process described above in which vacuum is used to volatilize a precursor containing both the Group III and V elements. Instead of employing a gaseous compound of a Group III element and a gaseous compound of a Group V element as separate precursors for III-V compound deposition, a single gaseous precursor is employed which is a coordination compound of one Group III element substituted with three volatilizable ligands and one Group V element substituted with three volatilizable ligands. Such coordination compounds are also referred to in the art as III-V donor acceptor complexes and as III-V Lewis acid and Lewis base adducts. Constant et al teaches avoiding ligand elimination leading to polymeric compounds. Although the coordination compound approach offers better replication of ratios of III and V elements, and to some extent ameliorates problems of toxicity and oxygen sensitivity, the limitations of using toxic and pyrophoric materials in coating remain unabated.

Zaouk et al, "Various Chemical Mechanisms for the Crystal Growth of III-V Semiconductors Using Coordination Compounds as Starting Material in the MOCVD Process", *Journal of Crystal Growth*, Vol. 55, 1981, pp. 135–144 discloses a variation on the process of Constant et al wherein elimination of one ligand from each of the III and V elements of the precursor is recognized to occur during heating. Maury et al, "Raman Spectroscopy Characterization of Polycrystalline GaP Thin Films Grown by MO-CVD Process Using [Et$_2$-Ga-PEt$_2$]$_3$ As Only Source", *Journal de Physique*, Colloque C1, suppl. no. 10, vol. 43, Oct. 1982, pp. C1-347 to C1-352, is essentially cumulative with Constant et al and Zaouk et al, except for employing polymeric precursors as starting materials. Zaouk et al and Maury et al share the disadvantages of Comfort et al.

Davey U.S. Pat. No. 4,427,714 describes forming III-V compound layers by spraying. For example, gallium arsenide layers are disclosed to be formed by processes including (1) spraying a solution of gallium arsenide or a precursor thereof with an inert gas propellant in a reducing gaseous atmosphere;

(2) spraying a solution of gallium/arsenic complex (each of the gallium and arsenic atoms having three substituent ligands) with an inert gas propellant in an inert or reducing atmosphere;

(3) creating a stable aerosol of trimethyl gallium dispersed in arsine, which is sprayed on a hot substrate; and (4) spraying a polymeric complex formed between trimethyl gallium and methyl or phenyl arsine.

All of the spraying processes are unattractive, since considerable unwanted deposition occurs on spray confining walls. Thus, precursor waste and burdensome cleaning of equipment are encountered.

It has been recognized that III-V compound layers can be produced by supplying liquids to substrate surfaces. Ladany et al U.S. Pat. No. 3,802,967 discloses first forming a thin III-V compound layer by CVD techniques and then increasing the thickness of this layer by conventional liquid phase epitaxy. For instance, in Example 1 a liquid consisting of 97 percent gallium, 2.99 percent gallium arsenide, and 0.01 percent tellurium is flowed over a 10 micrometer CVD GaAs layer on a spinel substrate by tipping a graphite boat containing the liquid and substrate. The temperature of the liquid is maintained at 700° C. The Ladany et al process, since it begins with CVD, incurs all of the disadvantages of that process and, in addition, is unattractive in requiring very high temperatures for liquid phase epitaxy.

Jensen U.S. Pat. No. 4,594,264 discloses a process for preparing gallium arsenide layers on monocrystalline, gallium arsenide, or silicon substrates. A gallium-arsenic complex is employed of the formula $$X_3GaAsR_3 \qquad (I)$$

where

X is chlorine, bromine, iodine, phenyl, benzyl, methyl, or trifluoromethyl, and

R is hydrogen, phenyl, benzyl, methyl, or trifluoromethyl.

The complex is dissolved in a hydrocarbon or chlorinated hydrocarbon solvent which is free of oxygen, sulfur, and nitrogen. The resulting solution is coated as a film on the substrate in an amount sufficient to form a gallium arsenide layer of from 1 to a few micrometers ($\mu$m) in thickness. The film is then heated to a temperature of less than 200° C. to volatilize the solvent while avoiding decomposition of the gallium-arsenic complex. The next step of the process is to convert the complex coating remaining to gallium arsenide by exposing the coating to ultraviolet (UV) radiation, such as the UV radiation from a laser. The presence of moisture and oxygen is avoided. All reactions were carried out under an inert, dry atmosphere (typically less than 1 ppm oxygen content) using purified, dry, oxygen-free solvents. Analysis of a layer produced from a complex of $Cl_3GaAs(C_6H_5)_3$ revealed that it had lost only 70 percent of the carbon and 54 percent of the chlorine of its parent coating as measured prior to UV exposure. These residual carbon and chlorine levels are, of course, unacceptably high for the majority of semiconductor uses.

It has been proposed in U.S. Pat. No. 4,833,103, Agostinelli et al, that a deposit of III-V compounds on a substrate be formed by casting of compounds of Group III and V elements that are combined with volatilizable ligands. While the process of Agostinelli produces III-V coatings, these coatings are difficult to form with consistently smooth mirror-like finish and without discontinuities such as pinholes. The Agostinelli et al process is difficult to control so as to produce optimum finishes.

There is a continuing need for improved methods of forming organo-metallic compounds such as III-V compounds. There is a need for methods that form uniform, microscopically smooth finishes of III-V compounds at low cost and with ease of processing.

THE INVENTION

An object of the invention is to overcome disadvantages of prior processes of forming III-V compounds.

An additional object is to provide uniform coatings of organo-metallic compounds.

An additional object of the invention is to provide a simple and reliable process for vapor deposition of organo-metallic compounds.

These and other objects of the invention are generally accomplished by providing a process comprising applying to a substrate a precursor of a III-V or other organo-metallic compound, the precursor preferably consisting of one or more pairs of ligand substituted Group III and Group V elements. The precursor is thermally vaporized, decomposes and deposits onto a receiving layer held at the decomposing temperature. The process is characterized in that (i) the precursor is preferably selected from among compounds in which the group III and V elements of each pair are joined by a thermally stable bond and the Group III and V elements are each substituted with two thermally decomposable ligands, (ii) a thin layer comprised of a liquid carrier and the precursor or the powdered precursor are applied to the substrate, (iii) the thin layer on the substrate is placed adjacent and generally parallel to a receiving member, (iv) the receiving member is heated to a temperature sufficient to decompose the III-V organo-metallic compound and achieve crystalline phase of the III-V inorganic material, and (v) the thin layer is then heated to a temperature sufficient to volatize the ligand-containing Group III and V compounds. A uniform layer of the III-V compound is deposited on the receiving layer. The preferred compounds for the process of this invention have been found to be gallium arsenide and gallium phosphide.

MODES OF PERFORMING THE INVENTION

Figure 1:
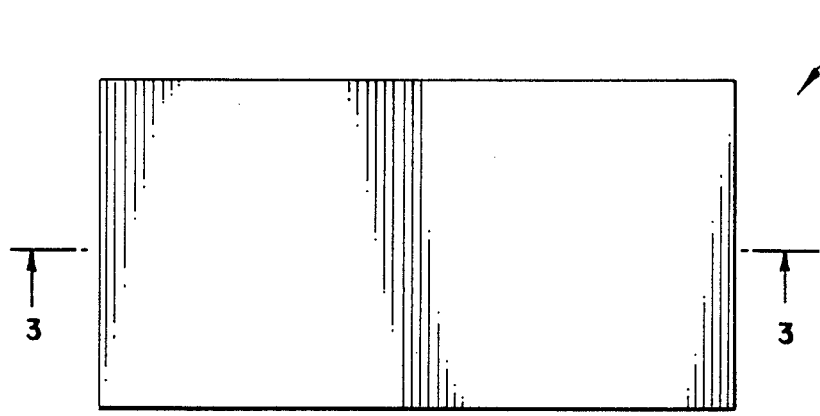
FIG. 1 and FIG. 2 are top and end views of apparatus for performing the invention.
Figure 2:
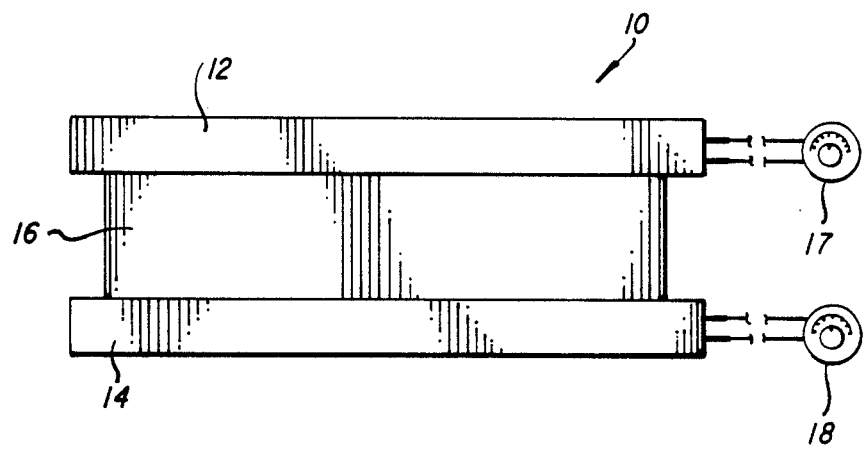

The process of the present invention offers significant advantages over prior art approaches to forming monophasic layers of III-V compounds. The process of the present invention in employing precursors containing pairs of III and V elements is inherently biased toward the desired stoichiometric balance of these elements. The process requires no particular control of ambient pressure during any step. Thus, the high vacuum equipment required by MBE can be entirely eliminated. At the same time, since spraying is not required to bring the precursor into contact with the substrate to be coated, indiscriminate loss of the precursor and fouling of equipment is avoided. No spray confining walls are required, and equipment is readily maintained free of unwanted depositions. The process of this invention allows thin, uniform layers of ligand free III-V compounds to be formed on a variety of substrates. Precise control of III-V compound layer thickness is readily achieved with the process of this invention. The process of this invention allows removal of precursor ligands (including all of their constituent elements) to leave III-V compound layers of purity levels satisfactory for semiconductor applications, including those requiring coatings of highly controlled purity levels. However, the process of the present invention does not require high temperatures, i.e., temperatures in excess of about 600° C. The process of the invention allows formation of successive layers on a receiving substrate for multiple layer formation of the same or different compositions. Additionally, the process of the invention is better able to coat irregular surfaces with the film of the organo-metallics of the invention than the MOCVD process. These and other advantages of the invention will be apparent from the following description:

FIGS. 1 and 2 are top and end views of apparatus for performing the process of the invention. The apparatus 10 is composed of an upper heating platen 12 and the lower heating platen 14. The platens are divided by spacer 16. The heating plates 12 and 14 are provided with heating control means 16 and 18, respectively. Control means 16 and 18 are used individually to adjust the temperature of plates 12 and 14. Further, at least control 18 is preferably capable of providing a ramp heating cycle to control the rate of vaporization.

Figure 3:
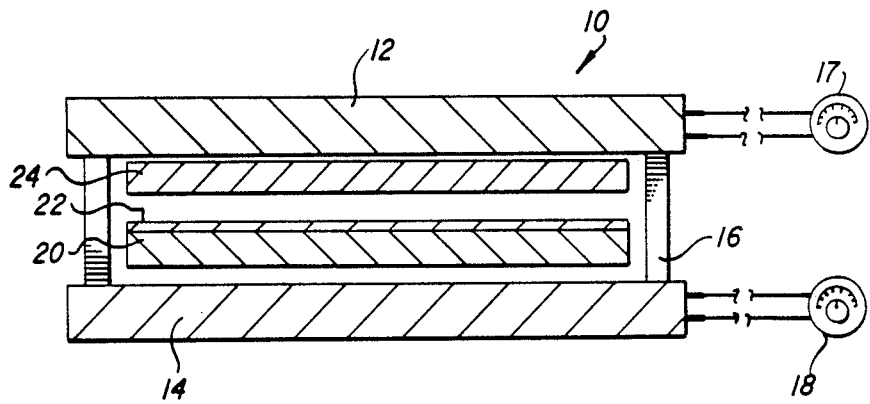
FIG. 3 is a cross-sectional view of line 3—3 of FIG. 1 prior to vapor deposition.
Figure 4:
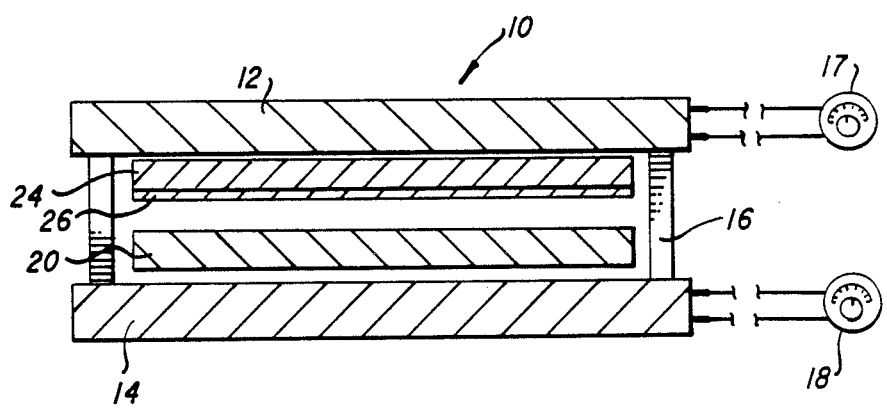
FIG. 4 is a cross-sectional view taken after vapor deposition.

FIGS. 3 and 4 are cross-sectional views on line 33 of FIG. 1. In FIG. 3, it is illustrated that the substrate 20 having thereon the layer of ligand containing Group III-V material 22. The receiving member 24 is arranged adjacent to heating platen 12 and held there, by a fastening means not shown. FIG. 4 illustrates that after heating, a layer of III-V compound 26 has been formed on receiving member 24. Heating member 12 is maintained at about 280° C. to about 500° C. and then the lower heating member 14 is heated to transfer heat through substrate 20 to layer 22 to cause it to vaporize. The vaporized ligand containing material is condensed and decomposed on receiving member 24 resulting in a layer 26 of gallium arsenide or other III-V compound. Spacer 16 acts to maintain the substrate 20 and receiving member 24 at the proper separation. Although a gas tight fit is not required for the process of the invention, some containment may increase film thickness and uniformity.

The present invention in its preferred form is directed to processes of forming layers of ligand-free III-V compounds, hereinafter, in accordance with art established usage, also referred to simply as III-V compounds. These compounds are formed of Group III (boron, aluminum, gallium, and indium) and Group V (nitrogen, phosphorus, arsenic, antimony, and bismuth) elements. The III-V compound layer can contain one or a combination of III-V compounds. For example, layers of binary III-V compounds, such as aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, boron nitride, boron phosphide, boron arsenide, and boron antimonide are specifically contemplated.

It is also contemplated that the III-V compound layer can be formed with a mixture of III-V compounds, if desired. For example, in light guides and lasers it is conventional practice to employ ternary III-V compounds, such as gallium aluminum arsenide, with the proportion of aluminum being varied as needed to modify the layer for its intended light guiding function. Other combinations of ternary III-V compounds specifically recognized to be useful are gallium arsenide phosphide, indium gallium arsenide, indium gallium phosphide, indium arsenide phosphide, aluminum gallium phosphide, and aluminum gallium antimonide, as well as quaternary compounds, such as indium gallium arsenide phosphide.

For semiconductor applications the monophasic layer usually contains minor amounts of one or more dopants intended to impart N or P type conductivity. N type conductivity can be achieved by substituting for some of the Group III elements in the III-V compound an element such as silicon or tin, or by by substituting from some of the Group V elements sulfur, selenium, or tellurium. P type conductivity is achieved by substituting for some of the Group III elements in the III-V compound an element such as zinc, cadmium, beryllium, or magnesium, or by substituting for some of the Group V elements germanium. Dopant levels are generally limited to amounts sufficient to impart semiconductive properties. The exact proportions of dopant will vary with the application intended, with semiconductor dopant levels of from $10^{15}$ to $10^{18}$ ions per cc being common. For some applications, such as those in which higher than semiconductive levels of conductivity are required, higher, degenerate dopant levels can be in evidence. It is a distinct advantage of the process of this invention that all dopant concentration levels conventionally found in III-V compound layers, particularly those employed in the fabrication of solid state, e.g., semiconductor-elements, can be reproducibly achieved.

III-V compound layers of from about 20 to about 10,000 Angstroms in thickness can be deposited in a single iteration of the process of the present invention, with single iteration layer thicknesses preferably being in the range of from about 100 to 10,000 Angstroms. Reiteration of the process can be undertaken to build up still thicker layers, if desired or layers with different composition. For instance, quantum well structures, used in solid state lasers, use layers of different materials. Additionally, where the composition of the III-V compound layer deposited according to this process matches that of the substrate on which it is deposited, the III-V compound layer can form an epitaxial extension of the initially present substrate. Thus, depending upon the substrate chosen, a single iteration of the process of the present invention can result in a III-V compound layer of any desired thickness.

The III-V compound layer is monophasic, meaning that the layer consists of a single phase of material. The layer can be monocrystalline, polycrystalline, or amorphous, depending upon the manner of its formation and, particularly, the substrate on which it is formed.

The process of the present invention begins with the selection of a receiver for coating. Any conventional receiver for coating a III-V compound layer can be selected. While the III-V compound layer can be formed on any refractory, e.g., tungsten, silicon carbide, or the like, it is preferred for semiconductor applications that the III-V compound layer be formed on an insulative or, particularly, a semiconductive substrate. Exemplary of useful insulative receiver materials are silicon nitride, aluminum oxide (particularly monocrystalline aluminum oxide, i.e., sapphire), and silicon dioxide (including amorphous, monocrystalline, and glass forms). Glasses containing elements in addition to silicon and oxygen are contemplated, particularly glasses having a thermal coefficient of expansion which approximates that of the III-V compound layer to be formed, e.g., borosilicate glass and borophosphosilicate glass.

Semiconductive elements, particularly monocrystalline semiconductive wafers, are highly useful receiving members for the practice of the invention. For example, any of the monocrystalline Group IV or III-V compound wafers conventionally employed in the manufacture of semiconductor elements can be employed as receiving members for the deposition of a III-V compound layer according to the present invention. For example, a major face lying in a {111}, {110}, or {100} crystal plane of a silicon, germanium, or III-V compound (e.g., gallium arsenide, gallium phosphide, or indium phosphide) wafer can serve as an ideal substrate for a III-V compound layer. Receiving member surfaces which match or at least approximate the crystal habit of the III-V compound forming the layer to be deposited are particularly advantageous in allowing III-V compound layers to be deposited which are monocrystalline and form an epitaxial extension of the original substrate.

An important aspect of the process of the present invention lies in the selection, from among known compounds, of the precursor of the III-V compound. For the practice of the present invention a precursor is chosen consisting of at least one pair of ligand substituted Group III and Group V elements. The Group III and V elements of each pair are joined by a thermally stable bond, and the Group III and V elements are each substituted with two thermally decomposable ligands.

These precursors differ markedly in their properties from the III-V coordination compounds (III-V donor acceptor complexes and III-V Lewis acid and Lewis base adducts) of the prior art in which each Group III and Group V element is substituted with three volatilizable ligands so that only a weak coordination bond exists between the Group III and Group V atoms.

In one aspect III-V compound precursors herein employed are those represented by Formula II:

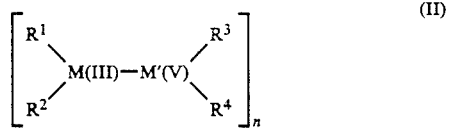

where
M(III) is a Group III element;
M'(V) is a Group V element;
$R^1$, $R^2$, $R^3$, and $R^4$ are independently chosen volatilizable ligands; and
n is an integer of from 1 to 5.

Preferred Group III elements are boron, aluminum, gallium, and indium. Preferred Group V elements are nitrogen, phosphorus, arsenic, and antimony. Specifically preferred Group III and V element combinations are gallium and arsenic, aluminum and arsenic, gallium and phosphorus, indium and phosphorus, boron and nitrogen, and aluminum and nitrogen.

Preferred ligands, decomposable to gases, are hydrogen, halogen (e.g., fluoride, chloride, bromide, and iodide), and hydrocarbon and substituted hydrocarbon ligands. The hydrocarbon ligands can be chosen from among aliphatic and aromatic hydrocarbons generally. Among useful hydrocarbon ligands are those consisting of simple hydrocarbon moieties, such as alkyl, alkenyl, alkynyl, and aryl groups, as well as hydrocarbon ligands which are composites of simple hydrocarbon moieties, such as alkaryl, aralkyl, aralkaryl, and alkaralkyl groups. Hydrocarbon ligand substituents can be selected from among a wide variety of known organic substituents and functional groups, including, but not limited to, halogen, silyl, and similar groups.

Where it is desired that the ligand be entirely volatilized or decomposed and none of its constituent elements employed to modify the III-V compound layer resulting, it is preferred to limit the ligands to those containing only one or more of hydrogen, halogen, and carbon. Because of the recognized response of semiconductive layers to trace impurity concentrations, ligands containing elements which are themselves Group III or V elements or which are known to be useful N or P conductivity type impurity dopants of III-V compounds are generally avoided, except where the ligands are intentionally chosen to modify the properties of the III-V compound layer to be formed.

The primary function of the ligands is to satisfy the two valence bonding positions of each Group III and V element not satisfied by the thermally stable bond between pairs of Group III and V elements. In addition, the ligands are preferably chosen to facilitate coating the III-V compound precursor in a liquid carrier on the substrate.

While individual hydrocarbon and substituted hydrocarbon ligands can have up to 20 or more carbon atoms, it is generally preferred to employ hydrocarbon and substituted hydrocarbon ligands containing from 1 to 10 carbon atoms. Specifically preferred hydrocarbon ligands are those in which aliphatic moieties consist of from 1 to 6 carbon atoms and aromatic moieties consist of from 6 to 10 carbon atoms.

In their simplest form, the III-V compound precursors of this invention contain a single pair of Group III and Group V elements. For example, in Formula II, n is 1. In this instance it can be seen that each Group III and Group V element exhibits only three bonding sites, and there is no weak fourth coordination bond, such as is in evidence in III-V coordination compounds. More particularly, the bond between the Group III and Group V elements is highly thermally stable. The Group III and Group V bond is, in fact, significantly more thermally stable than that linking the Group III and Group V elements with their ligands.

When the III-V compound precursor contains more than one pair of Group III and Group V elements, e.g., when n in Formula II is greater than 1, it is generally accepted that the Group III and Group V elements are conjugated in a cyclic chain or ring. That is, each Group III element is bonded to two ligands and to two adjacent Group V elements, and each Group V element is similarly bonded to two ligands and two adjacent Group III elements. On heating these polymeric III-V compound precursors are believed to revert to corresponding monomer (e.g., n=1 in Formula II).

In one specifically preferred form, III-V compound precursors contemplated for use in the practice of the invention are those satisfying Formula III:

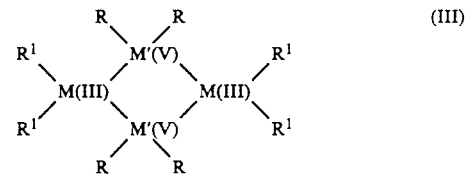

where
M(III) is a Group III element, most preferably gallium, aluminum, or indium;
M'(V) is a Group V element, most preferably nitrogen, phosphorus, or arsenic; and
R and $R^1$ are independently hydrogen, halogen, or a hydrocarbon of from 2 to 10 carbon atoms, most preferably a hydrocarbon of from 2 to 6 carbon atoms.

Specific illustrations of III-V compound precursors contemplated for use in the practice of this invention are the following:

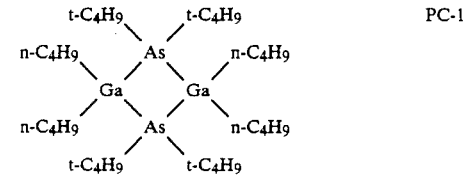

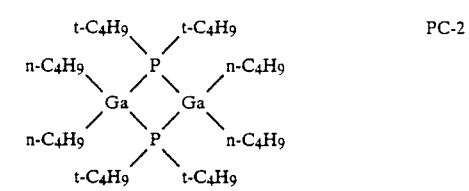

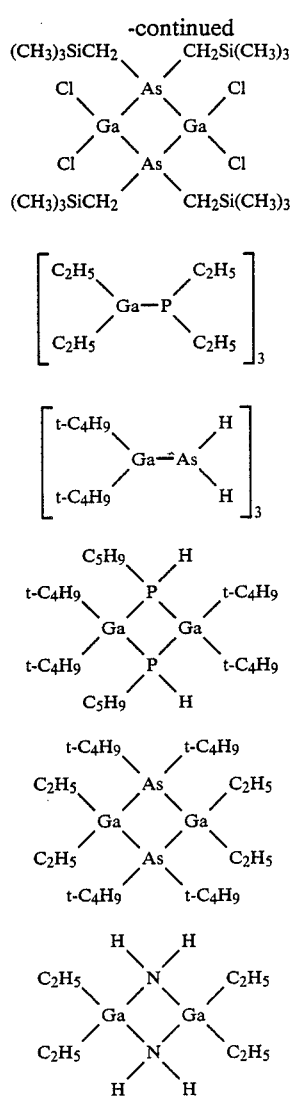

Techniques for preparing III-V compound precursors for use in the practice of the present invention will be readily apparent from the teachings of A. M. Arif, B. L. Benac, A. H. Cowley, R. Geerts, R. A. Jones, K. B. Kidd, J. M. Power, and S. T. Schwab, "Mono- and Di-nuclear Phosphido and Arsenido Complexes of Gallium; Ga(EBu$^{t}$$_2$)$_3$, Ga[PH(2,4,6-Bu$^{t}$$_3$C$_6$H$_2$)]$_3$ and Ga[($\mu$-EBU$^{t}$$_2$)R$_2$]$_2$, E=P,As; R=Me,Bu$^{n'}$, J. Chem. Soc., Chem. Commun., 1986, pp. 1543–1545; A. Zaouk, E. Salvetat, J. Sakaya, F. Maury, and G. Constant, "Various Chemical Mechanisms for the Crystal Growth of III-V Semiconductors Using Coordination Compounds as Starting Material in the MOCVD Process", Journal of Crystal Growth, Vol. 55, 1981, pp. 135–144; F. Maury, H. Combes, R. Caries, and J. B. Renucci, "Raman Spectroscopy Characterization of Polycrystalline GaP Thin Films Grown by MO-CVD Process Using [Et$_2$Ga-PEt$_2$]$_3$ As Only Source", Journal de Physique, Colloque C1, suppl. no. 10, vol. 43, Oct. 1982, pp. C1-347 to C1-252; and C. G. Pitt, A. P. Purdy, K. T. Higa, and R. L. Wells, "Synthesis of Some Arsinogallanes and the Novel Rearrangement of a Dimeric Bis(arsino)gallane, Bis{bis(bis[(tri-methylsilyl)methyl]arsino]arsino)chlorogallane}", Organometallics, 1986, Vol. 5, p. 1266.

To apply the III-V compound precursor to the substrate, a liquid coating composition preferably is formed. The coating composition can be formed merely by dissolving the precursor into a carrier liquid. To achieve the highest possible level of dispersion of the precursor in the carrier liquid, it is preferred to employ carrier liquids which are solvents for the precursor. Generally useful coating compositions can be formed when the precursor forms greater than 1 percent by weight of the coating composition, preferably at least about 5 percent by weight of the coating composition, based on total weight. The precursor can be introduced into the carrier liquid up to its solubility limit, if desired. A generally optimal precursor concentration range in the liquid carrier is from about 10 to 15 percent, based on total weight.

The next step is to apply the preferred liquid coating composition to the substrate. Any one of a variety of conventional coating techniques known to be capable of laying down thin coatings can be chosen for this purpose. For example, immersion or dip or doctor-blade coating can be employed. A preferred technique for forming a uniform coating on the substrate is by spin coating. This technique, which is widely used in forming uniform photoresist composition coatings on semiconductors, involves applying a small amount of the coating composition to the substrate and then rotating the substrate. The centrifugal forces exerted by the spinning motion distribute coating composition uniformly on the substrate and result in excess coating material being expelled from the substrate surface along its edges. By controlling the rate of spinning and the viscosity of the coating composition, the thickness of the stable coating remaining on the substrate can be controlled.

Preferred carrier liquids are those which are solvents for the III-V compound precursor. In addition, the carrier liquid is preferably chosen to avoid reaction with the precursor. That is, a relatively nonreactive or inert carrier liquid is preferably chosen. It is also advantageous to choose a carrier liquid that is readily volatilized after coating. For example, carrier liquids which evaporate on standing under ambient conditions are advantageous, although carrier liquids that exhibit significant evaporative loss prior to coating are generally avoided. An alternative is to choose carrier liquids which are volatilized on heating prior to or along with the ligands in the course of converting the precursor into the desired III-V compound layer. Illustrations of specific carrier liquids are hydrocarbons, including substituted hydrocarbons, such as halogenated hydrocarbons, which are liquid under ambient conditions, e.g., benzene, toluene, octane, decane, terpenes, and similar hydrocarbons. Other liquid organic solvents are contemplated, particularly those that contain only carbon, hydrogen, or halogen atoms.

The primary function of the carrier liquid is to provide a liquid phase for dispersing the III-V compound precursor. The carrier liquid is also chosen for its ability to cover the substrate uniformly. Thus, an optimum liquid carrier selection is in part determined by the substrate chosen. Generally more desirable film forming properties are observed with more viscous carrier liquids and those which more readily wet the substrate alone, or with an incorporated volatilizable film forming agent. In one form the film forming agent can take the form of a wetting agent, such as a volatilizable surfactant. Depending upon the composition of the atmosphere chosen for carrier liquid volatilization, other film forming agents can be employed. For example, organic inert compounds capable of being volatilized in a reducing (e.g., argon) atmosphere can be employed.

Alternatively, rather than using the preferred liquid formation technique, it is possible to spread a layer of the III-IV compound precursor as a powder at the substrate and then heat to vaporize or decompose the precursor. This is less preferred as handling of the coated substrate is difficult and uniform coating is more difficult than with the liquid formation.

After the III-V compound precursor coating has been formed on the substrate and preferably after the liquid carrier has spontaneously evaporated, the coated substrate is placed into apparatus 10 on the platen 14. A receiving substrate 24 is placed above and parallel to the coated substrate and attached to heated platen 12. In performing the process, it is important that the platen carrying the receiving surface be heated to the decomposition temperature of the liquid containing compound which suitably is in the range of about 280° C. to 500° C., but preferably 320° C. for the preferred materials of the invention. The receiving substrate is heated to this temperature before or after being placed adjacent the precursor coated substrate. After the apparatus is assembled such that the receiving member and the coated substrate are closely adjacent, the lower platen is heated in a ramp manner to at least the volatilization temperature of the ligand containing material. This typically will be about 220° C. The heating may be continued to the receiving substrate temperature, such as 320° C., if desired. After heating is complete, the platens are cooled and the receiving substrate bearing a coating of the III-V composition may be removed. The ramp heating rate of the substrate bearing the precursor is generally between 1° C. and about 5° C. per minute.

The spacing between the receiving member and the coated substrate may be any spacing that provides a good transferred coating of the III-V compound. Typically, the spacing is between about 1 millimeter and about 7 millimeters.

The substrate may be formed from any non-reactive material that is stable up to the temperatures of up to 350° C. utilized in the process. Preferred is quartz glass, as it is low in cost, stable and non-reactive.

While the invention has been described with reference to the preferred III-V materials, it is also considered within the invention that other organically combined materials could be utilized in the vapor deposition process of the invention. Such materials would include the materials of Group VI and IIB of the Periodic Table of the Elements as adopted by the American Chemical Society. It is also considered within the invention to form transitional elements by the organic coating and the vapor deposition process of the invention.

Following heating the III-V compound layer and its substrate can be brought back to ambient temperature by any convenient method. To minimize thermal stress on the product article, it is generally preferred to return to ambient temperatures gradually. Generally the magnitude of thermal stress increases with the area of the layer being prepared. Thus, in working with larger diameter receiving members annealing and slow rates of cooling are desirable. It is also desirable to maintain the layer in contact with the inert or reducing atmosphere until temperatures below about 100° C. are reached.

Upon cooling, the III-V compound layer can be put to use without further processing, if desired. For example, the III-V compound layer can be used as formed as a light guide. In most instances further steps are undertaken to produce a desired end product, such as a semiconductor device. These steps can be carried out in any convenient conventional manner for acting on conventional III-V compound coatings and therefore require no detailed description.

EXAMPLES

The invention can be better appreciated by reference to the following specific examples:

EXAMPLE 1

For the preparation of the gallium arsenide films, a precursor solution, 10% weight to volume of $\{(C_4H_9)_2GaAs(C_4H_9)_2\}_2$, is dissolved in hexane and 50 $\mu$l of this solution is deposited onto a one-inch diameter quartz disc. After the solvent has evaporated off, a 4 mm quartz ring is placed on the quartz disc and then a silica glass (quartz) receiver member placed on top of the ring. The quartz disc containing the precursor is heated at 5° C. per minute to 330° C. Prior to heating the quartz disc, the temperature of the receiver is heated to and is maintained at 330° C. Mirrorlike film formed on the receiver member during the process.

Analyses of the film by X-ray diffraction indicated the presence of polycrystalline gallium arsenide. No other crystalline phases were detected. Analyses of the films by X-ray fluorescence indicated that the gallium and arsenic ratio was, within experimental error, that expected for pure gallium arsenide.

EXAMPLE 2

For the preparation of the gallium arsenide films, the precursor, 10% weight to volume of $[(n-C_4H_9)_2GaAs(t-C_4H_9)_2]_2$ (precursor 1) is dissolved in hexane by stirring and 50 $\mu$l of this solution is deposited by pipette onto a one-inch quartz disc. After the solvent is evaporated off, a 5 mm high quartz ring is placed on the quartz disc and then a quartz receiver substrate is then heated to 330° C. at 30° C./minute by heating while contact with a resistively heated aluminum block.

After the quartz receiver substrate has equilibrated at 330° C. for 10 minutes, the quartz disc containing the precursor is heated from ambient temperatures to 220° C. in 10 minutes and then to 330° C. at 5° C./minute. On completion of the heating cycle, both the quartz disc originally containing the substrate and the quartz receiver substrate are allowed to cool to ambient conditions.

Appearance of the film formed on the quartz receiver substrate was specular. The thickness of the film, as measured using a profilometer, indicated that the film was approximately 2500 Å thick while analyses of the film by X-ray diffraction indicated the presence of polycrystalline gallium arsenide. No other crystalline phases were detected.

EXAMPLE 3

As in Example 1, except that the solution of the precursor is cast onto the quartz using a spin coating process. The precursor solution is spun at 2000 rpm for 20 seconds prior to processing as desribed above.

The appearance and analysis of the film formed in this example is similar to that formed in Example 1.

EXAMPLE 4

As in Example 1, except that the precursor is not dissolved in any solvent but used directly in the crystalline state. Thus, 5 mg of the precursor is placed on the quartz disc and processed as described above. At approximately 160° C. the precursor melts, and little droplets can be observed prior to its volatilization and subsequent decomposition onto the quartz receiver substrate.

The appearance and analysis of the film formed in this example is similar to that formed in Example 1.

EXAMPLE 5

As in Example 1, except that the temperature of the quartz disc containing the substrate is maintained at 210° C. during the entire time of processing.

The appearance and analysis of the film formed in this example is similar to that formed in Example 1.

EXAMPLE 6

As in Example 1, except that a 2 mm high quartz ring is used instead of the 5 mm high ring for separating the disc containing the precursor from the quartz receiver substrate.

The appearance and analysis of the film formed in this example is similar to that formed in Example 1.

EXAMPLE 7

As in Example 1, except that a 9 mm high quartz ring is used instead of the 5 mm high ring for separating the disc containing the precursor from the quartz receiver substrate.

The appearance of this film was much inferior to that observed in Example 1. Not only was the film formed nonuniform in appearance, but it was also much less dense due to deposition occuring on the walls of the quartz disc spacer and not on the receiver substrate.

EXAMPLE 8

As in Example 3, except that the precursor [(t-$C_4H_9$)$_2$GaP(H,$C_5H_9$)]$_2$ was used instead of precursor 1.

A rough textured film was formed on the quartz receiver substrate which was analyzed by X-ray diffraction as polycrystalline gallium phosphide. No other crystalline phases were detected. If specular films are desired, changing the temperature of deposit or changing the ligands of the precursor could be carried out to achieve such specular films.

EXAMPLE 9

As in Example 3, except that the precursor [($C_2H_5$)$_2$InAs(t-$C_4H_9$)]$_2$ was used instead of precursor 1.

A rough textured film was formed on the quartz receiver substrate. Analysis of this film by X-ray diffraction indicated the presence of both polycrystalline indium arsenide as the major phase and about 10% of indium metal as a secondary phase. If specular films are desired, changing the temperature of deposit or changing the ligands of the precursor could be carried out to achieve such specular films.

The invention has been described in detail with particular reference to preferred embodiments thereof, but it will be understood that variations and modifications can be effected within the spirit and scope of the invention.

What is claimed is:

1. A method of forming a thin film comprising forming a Group III-V organo-metallic material solution, distributing said solution onto a substrate to form a stable coating of said organo-metallic material, placing a receiver generally parallel to and spaced from said stable coating on said substrate having the material thereon, heating said receiver, and heating said substrate to vaporize the material on said substrate thereby forming a film of Group III-V material on said receiver.

2. The method of claim 1 wherein said organo-metallic comprises gallium arsenide.

3. The method of claim 2 wherein said receiver is heated to between about 280° C. and about 500° C.

4. The method of claim 1 wherein said substrate and said receiver comprise silicon.

5. The method of claim 1 wherein said method is repeated several times to form multiple coats onto said receiver.

6. The method of claim 1 wherein spacers are provided at least at the edges of said substrate and said receiver to separate said substrate and said receiver.

7. The method of claim 1 wherein said distributing comprises spin coating of the material.

8. The method of claim 1 wherein said casting solution comprises a solvent and a ligand substituted organic-metallic material dissolved in said solvent.

9. The method of claim 1 wherein said distributing on said substrate comprises casting of a solvent solution of said organo-metallic material.

10. The method of claim 1 wherein said coating comprises a coating of organo-metallic powder.

11. A method of vapor deposition comprising volatilizing a coating of a ligand substituted Group III-V organo-metallic compound, contacting a heated receiver with gases from said volatilizing thereby to decompose said gases and deposit a Group III-V material on said receiver.

12. The method of claim 11 wherein said receiver is at a higher temperature than the decomposition temperature of the vapor formed by volatilization of the organo-metallic compound.

13. The method of claim 11 wherein said deposit comprises a film that is smooth and of the III-V crystal structure.

14. A process comprising applying to a substrate a precursor of an organo-metallic Group III-V compound, the precursor consisting of one or more pairs of ligand substituted Group III and Group V elements,
bringing a receiver member closely adjacent said substrate,
heating said receiver member to a temperature, at or above the decomposition temperature of said precursor,
heating said substrate to volatilize said precursor, and thereby depositing a film of III-V compound on said receiver member.

15. The method of claim 14 wherein said precursor comprises

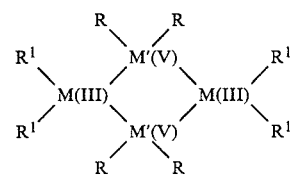

where
M(III) is a Group III element chosen from the class consisting of gallium, aluminum, or indium;

M'(V) is a Group V element chosen from the class consisting of nitrogen, phosphorus, or arsenic; and R and $R^1$ are independently hydrogen, halogen, or a hydrocarbon of from 2 to 10 carbon atoms.

16. A process according to claim 15 further characterized in that the precursor is chosen from at least one of the group consisting of

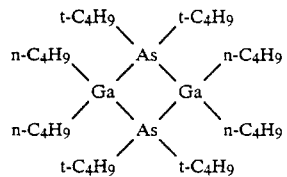

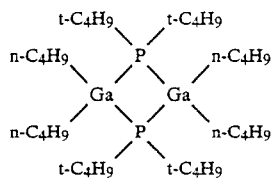

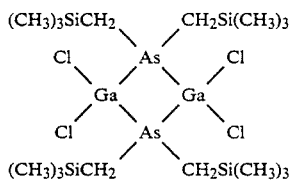

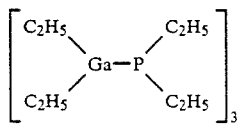

-continued

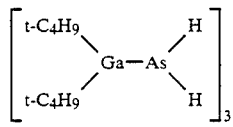

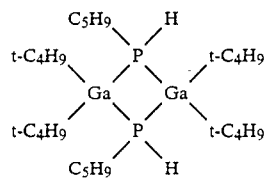

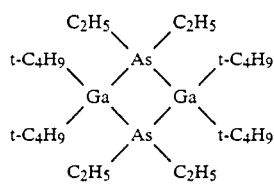

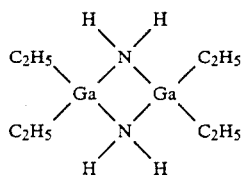

17. The process of claim 1 wherein said receiver member is heated to between about 280° C. and 500° C.

18. The method of claim 1 wherein the spacing between said substrate and said receiver is between about 1 millimeter and about 7 millimeters.

19. The method of claim 11 wherein said coating and said receiver are spaced between about 1 millimeter and about 7 millimeters apart.

20. The process of claim 15 wherein closely adjacent comprises between about 1 millimeter and about 7 millimeters apart.

* * * * *

UNITED STATES PATENT AND TRADEMARK OFFICE
CERTIFICATE OF CORRECTION

PATENT NO. : 4,975,299
DATED : December 4, 1990
INVENTOR(S) : Mir et al

It is certified that error appears in the above-identified patent and that said Letters Patent is hereby corrected as shown below:

Column 14, line 28, "1" should read --11--.

Signed and Sealed this

Twenty-eighth Day of April, 1992

Attest:

HARRY F. MANBECK, JR.

Attesting Officer

Commissioner of Patents and Trademarks